(12) United States Patent
Venkatesan et al.

(10) Patent No.: US 7,532,728 B2
(45) Date of Patent: May 12, 2009

(54) MECHANISM FOR USING THE ALLPASS DECOMPOSITION ARCHITECTURE FOR THE CAUER LOW PASS FILTER USED IN A BTSC

(75) Inventors: Gopal Venkatesan, Aliso Viejo, CA (US); Amy Hundhausen, Laguna Beach, CA (US); Hosahalli Srinivas, Irvine, CA (US); Erik Berg, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 962 days.

(21) Appl. No.: 10/784,574

(22) Filed: Feb. 23, 2004

(65) Prior Publication Data

US 2005/0036627 A1      Feb. 17, 2005

Related U.S. Application Data

(60) Provisional application No. 60/495,503, filed on Aug. 14, 2003.

(51) Int. Cl.
*H04R 5/00* (2006.01)
(52) U.S. Cl. .................. 381/23; 381/106; 381/108; 348/484; 348/738; 704/501

(58) Field of Classification Search .................. 381/1, 381/23, 17–19, 22, 108, 2, 106, 107; 348/480–485, 348/738; 375/295; 704/500, 501
See application file for complete search history.

(56) References Cited

U.S. PATENT DOCUMENTS

| | | | | |
|---|---|---|---|---|
| 5,796,842 | A | * | 8/1998 | Hanna ........................... 381/4 |
| 6,037,993 | A | * | 3/2000 | Easley ........................ 348/485 |
| 6,118,879 | A | * | 9/2000 | Hanna ........................ 381/106 |
| 6,192,086 | B1 | * | 2/2001 | Darr ............................ 375/295 |
| 6,259,482 | B1 | * | 7/2001 | Easley et al. ................. 348/485 |
| 6,426,977 | B1 | * | 7/2002 | Lee et al. ..................... 375/259 |
| 6,588,867 | B1 | * | 7/2003 | Darr ....................... 375/240.07 |
| 7,277,860 | B2 | * | 10/2007 | Srinivas et al. .............. 704/500 |
| 7,463,310 | B2 | * | 12/2008 | Berg et al. ................... 348/484 |

* cited by examiner

*Primary Examiner*—Vivian Chin
*Assistant Examiner*—Jason R Kurr
(74) *Attorney, Agent, or Firm*—Garlick Harrison & Markison

(57) ABSTRACT

An BTSC encoder with an improved digital filter structure substantially implemented on a single CMOS integrated circuit is described. By cascading first and second order allpass filter structures to form a higher order digital filter, such as a Cauer low pass filter, limit cycle oscillations are reduced or eliminated, word-length growth from one stage to the next is contained, and a more efficient overall filter structure and performance is obtained.

14 Claims, 7 Drawing Sheets

700

MECHANISM FOR USING THE ALLPASS DECOMPOSITION ARCHITECTURE FOR THE CAUER LOW PASS FILTER USED IN A BTSC

RELATED APPLICATIONS

This patent application claims priority from U.S. Provisional Patent Application Ser. No. 60/495,503, entitled "Mechanism for Using the Allpass Decomposition Architecture for the Cauer Low Pass Filter Used in a BTSC Encoder" filed on Aug. 14, 2003.

BACKGROUND OF THE INVENTION

1. Field of the Invention

The present invention is directed in general to television modulators. In one aspect, the present invention relates to a method and system for digitally filtering audio signal information in accordance with established standards for the broadcast of stereophonic cable and television signals in the United States and in other countries. In a further aspect, the present invention provides an integrated circuit system for filtering audio signals using allpass decomposition Cauer low pass filters to generate an aural composite signal in a digital BTSC encoder.

2. Related Art

In 1984, the Federal Communications Commission (FCC) adopted a standard for the audio portion of television signals called Multichannel Television Sound (MTS) which permitted television programs to be broadcast and received with bi-channel audio, e.g., stereophonic sound. Similar to the definition of stereo for FM radio broadcast, MTS defined a system for enhanced, stereo audio for television broadcast and reception. Also known as BTSC stereo encoding (after the Broadcast Television System Committee (BTSC) that defined it), the BTSC transmission methodology is built around the concept of companding, which means that certain aspects of the incoming signal are compressed during the encoding process. A complementary expansion of the signal is then applied during the decoding process.

The original monophonic television signals carried only a single channel of audio. Due to the configuration of the monophonic television signal and the need to maintain compatibility with existing television sets, the stereophonic information was necessarily located in a higher frequency region of the BTSC signal, making the stereophonic channel much noisier than the monophonic audio channel. This resulted in an inherently higher noise floor for the stereo signal than for the monophonic signal. The BTSC standard overcame this problem by defining an encoding system that provided additional signal processing for the stereophonic audio signal. Prior to broadcast of a BTSC signal by a television station, the audio portion of a television program is encoded in the manner prescribed by the BTSC standard, and upon reception of a BTSC signal, a receiver (e.g., a television set) then decodes the audio portion in a complementary manner. This complementary encoding and decoding ensures that the signal-to-noise ratio of the entire stereo audio signal is maintained at acceptable levels.

FIG. 1 is a block diagram of the front end portion of an analog BTSC encoding system 100, as defined by the BTSC standard. Encoder 100 receives left and right channel audio input signals (indicated in FIG. 1 as "L" and "R", respectively) and generates a conditioned sum signal ("L+R") and an encoded difference signal ("L−R"). It should be appreciated that, while the system of the prior art and that of the present invention is described as useful for encoding the left and right audio signals of a stereophonic signal that is subsequently transmitted as a television signal, the BTSC system also provides means to encode a separate audio signal called SAP (secondary audio program), e.g., audio information in a different language, which is separated and selected by the end receiver. Further, noise reduction components of the BTSC encoding system can be used for other purposes besides television broadcast, such as for improving audio recordings.

System 100 includes an input section 110, a sum channel processing section 120, and a difference channel processing section 130. Input section 110 receives the left and right channel audio input signals and generates a sum signal (indicated in FIG. 1 as "L+R") and a difference signal (indicated in FIG. 1 as "L−R"). It is well known that for stereophonic signals, the sum signal L+R may be used by itself to provide monophonic audio reproduction and it is this signal that is decoded by existing monophonic audio television sets to reproduce sound. In stereophonic receivers, the sum and difference signals can be added to and subtracted from one another to recover the original two stereophonic signals (L) and (R). Input section 110 includes two signal adders 112, 114. Adder 112 sums the left and right channel audio input signals to generate the sum signal, and adder 114 subtracts the right channel audio input signal from the left channel audio input signal to generate the difference signal.

To accommodate transmission path conditions for television broadcasts, the difference signal is subjected to additional processing than that of the sum signal so that the dynamic range of the difference signal can be substantially preserved as compared to the sum signal. More particularly, the sum channel processing section 120 receives the sum signal and generates the conditioned sum signal. Section 120 includes a 75 µs preemphasis filter 122 and a bandlimiter 124. The sum signal is applied to the input of filter 122 which generates an output signal that is applied to the input of bandlimiter 124. The output signal generated by the latter is then the conditioned sum signal.

The difference channel processing section 130 receives the difference signal and generates the encoded difference signal. Section 130 includes a fixed preemphasis filter 132 (shown implemented as a cascade of two filters 132a and 132b), a variable gain amplifier 134 preferably in the form of a voltage-controlled amplifier, a variable preemphasis/deemphasis filter (referred to hereinafter as a "variable emphasis filter") 136, an overmodulation protector and bandlimiter 138, a fixed gain amplifier 140, a bandpass filter 142, an RMS level detector 144, a fixed gain amplifier 146, a bandpass filter 148, an RMS level detector 150, and a reciprocal generator 152. The processing of the difference signal ("L−R") by section 130 is substantially as described in the Background section of U.S. Pat. No. 5,796,842, which explains that the BTSC standard rigorously defines the desired operation of the 75 µs preemphasis filter 122, the fixed preemphasis filter 132, the variable emphasis filter 136, and the bandpass filters 142, 148, in terms of idealized analog filters. Specifically, the BTSC standard provides a transfer function for each of these components and the transfer functions are described in terms of mathematical representations of idealized analog filters. The BTSC standard further defines the gain settings, Gain A and Gain B, of amplifiers 140 and 146, respectively, and also defines the operation of amplifier 134, RMS level detectors 144, 150, and reciprocal generator 152. The BTSC standard also provides suggested guidelines for the operation of overmodulation protector and bandlimiter 138 and bandlimiter 124. Specifically, bandlimiter 124 and the bandlimiter portion of overmodulation protector and bandlimiter 138 are described as low pass filters with cutoff frequencies of 15 kHz, and the overmodulation protection portion of overmodulation protector and bandlimiter 138 is described as a threshold device that limits the amplitude of the encoded difference signal to 100% of full modulation where full modulation is the maximum permissible deviation level for modulating the audio subcarrier in a television signal.

To create the stereo signal, the BTSC standard also defines a composite stereophonic baseband signal (referred to hereinafter as the "composite signal") that is used to generate the audio portion of a BTSC signal. The composite signal is generated using the conditioned sum signal ("L+R"), the encoded difference signal ("L−R"), and a tone signal, commonly referred to as the "pilot tone" or simply as the "pilot," which is a sine wave at a frequency Fp, where Fp is equal to 15,734 Hz.

FIG. 2 is a graph of the spectrum of the composite signal. In FIG. 2, the spectral band 202 containing the content of the conditioned sum signal (or the "sum channel signal") is indicated as "L+R." The spectral sideband 204 containing the content of the frequency shifted encoded difference signal (or the "difference channel signal") is each indicated as "L−R," and the pilot tone 210 is indicated by the arrow at frequency Fp. In addition, the spectral sideband 206 containing the content of the frequency shifted encoded secondary audio program (or the "secondary audio channel") is each indicated as "SAP," and the spectral sideband 208 containing the content of the frequency shifted professional channel is each indicated as "Professional Channel." As shown in FIG. 2, the encoded difference signal is used at 100% of full modulation, the conditioned sum signal is used at 50% of full modulation, and the pilot tone is used at 10% of full modulation.

The encoded "L+R" and "L−R" signals are transmitted to the receiver, such as a stereo television set, where a stereo decoder uses both the "L+R" and "L−R" signals in a matrix that decodes and restores the original L and R audio program. For purposes of transmitting a BTSC encoded signal, a third signal, called the pilot subcarrier signal 210, is inserted between the main-channel signal 202 (L+R) and the stereo signal 204 (L−R), as illustrated in FIG. 2. According to the BTSC standard, the pilot subcarrier shall be frequency locked to the horizontal scanning frequency of the transmitted video signal, and may be used to indicate the presence of multiple sound channels or to process these sound channels at the receiver. The composite signal is generated by multiplying the encoded difference signal by a waveform that oscillates at twice the pilot frequency according to the cosine function $\cos(4\pi Fpt)$, where t is time, to generate an amplitude modulated, double-sideband, suppressed carrier signal and by then adding to this signal the conditioned sum signal and the pilot tone.

In the past, BTSC stereo encoders and decoders were implemented using analog circuits. Through careful calibration to tables and equations described in the BTSC standard, the encoders and decoders could be matched sufficiently to provide acceptable performance. However, conventional analog BTSC encoders (such as described in U.S. Pat. No. 4,539,526) have been replaced by digital encoders because of the many benefits of digital technology. Prior attempts to implement the analog BTSC encoder 100 in digital form have failed to exactly match the performance of analog encoder 100. This difficulty arises from the fact that the BTSC standard defines all the critical components of idealized encoder 100 in terms of analog filter transfer functions, and prior digital encoders have not been able to provide digital filters that exactly match the requirements of the BTSC-specified analog filters. As a result, conventional digital BTSC encoders (such as those described in U.S. Pat. Nos. 5,796,842 and 6,118,879) have deviated from the theoretical ideal specified by the BTSC standard, and have attempted to compensate for this deviation by deliberately introducing a compensating phase or magnitude error in the encoding process.

An additional drawback with conventional digital encoders is the complexity and performance problems associated with digitally filtering the audio signals in a signal encoder. For example, direct mapping of analog filters into the digital domain can result in signal distortion from frequency warping in the filter response. Another problem occurs when there is inadequate attenuation in a frequency region of interest, such as with the audio low pass filters referenced in the BTSC standard for preventing crosstalk into other channels or into the pilot spectrum space. Conventional low order Cauer low pass solutions (such as suggested in "Multichannel Television Sound—BTSC System Recommended Practices," EIA Television Systems Bulletin No. 5, Section 2.4.1 (July 1985)) require additional filtering (such as notch filters for the BTSC pilot frequency) or have used finite impulse response filters with insufficient cutoff. Other Cauer filter solutions have used infinite impulse response filters that suffer from limit cycle behavior as the filter order increases or that require processing and truncation of additional bits so that the least significant bits are ignored.

In addition to the complexity of the computational requirements for encoding the stereo signals, such as described above, the ever-increasing need for higher speed communications systems imposes additional performance requirements and resulting costs for BTSC encoding systems. In order to reduce costs, communications systems are increasingly implemented using Very Large Scale Integration (VLSI) techniques. The level of integration of communications systems is constantly increasing to take advantage of advances in integrated circuit manufacturing technology and the resulting cost reductions. This means that communications systems of higher and higher complexity are being implemented in a smaller and smaller number of integrated circuits. For reasons of cost and density of integration, the preferred technology is CMOS. To this end, digital signal processing ("DSP") techniques generally allow higher levels of complexity and easier scaling to finer geometry technologies than analog techniques, as well as superior testability and manufacturability.

Conventionally known audio encoding systems, such as BTSC encoders, have not provided adequate digital filtering during audio signal encoding. Further, the nature of existing analog BTSC encoders has made them inconvenient to use with digital equipment such as digital playback devices. A digital BTSC encoder could accept the digital audio signals directly and could therefore be more easily integrated with other digital equipment. Therefore, there is a need for a better system that is capable of performing the above functions and overcoming these difficulties without increasing circuit area and operational power. Further limitations and disadvantages of conventional systems will become apparent to one of skill in the art after reviewing the remainder of the present application with reference to the drawings and detailed description which follow.

SUMMARY OF THE INVENTION

In accordance with the present invention, an integrated circuit system and method are provided for digitally encoding stereophonic audio signals in accordance with the BTSC standard. In a selected embodiment, an improved digital difference channel processing section is provided with an infinite impulse response (IIR) filter, such as higher order elliptical filter, which is implemented using an allpass decomposition filter structure that operates at a high sampling rate. The filter implementation uses a cascade of lower order stages, where each stage is an allpass filter. The cascading of allpass stages (with unity gain) help in containing wordlength growth from one stage to the next, and also reduce oscillations known as limit cycles whereby a periodic output is obtained even after the input signal has been removed.

In a selected embodiment, a digital integrated circuit BTSC signal encoder is provided for encoding first and second digital audio signals (e.g., Left and Right stereo audio signals). The encoder is constructed with a higher order IIR digital filter implemented using an allpass decomposition architecture. In accordance with the present invention, the higher order (for example, eighth order or higher) IIR digital filter (such as a Butterworth, Chebychev, elliptical or Cauer filter) that is used for the input or output low pass filter of a BTSC encoder, and is formed from a cascade of lower order allpass filters, such as a plurality of first order or second order allpass filters. Alternatively, the higher order IIR digital filter is a pre-emphasis filter, bandpass filter or variable emphasis compander filter in the BTSC encoder. A matrix is included that receives digital left and right audio signals and uses an adder to sum the left and right digital audio signals to generate a digital sum signal. The matrix also uses a subtractor to subtract the right audio signal from the left audio signal to generate a digital difference signal. The digital sum signal is digitally processed by a sum channel processor that includes a first digital filter, such as a preemphasis filter. The digital difference signal is processed by the difference channel processor which includes a second digital filter, such as a fixed preemphasis variable emphasis filter, bandlimit filter or bandpass filters. With the present invention, the higher order IIR digital filter, matrix and channel processors are formed as part of a digital BTSC encoder that operates at a first sample rate to substantially match BTSC analog filter transform functions in both magnitude and phase, where the BTSC encoder may be formed as a CMOS integrated circuit on a single silicon substrate.

With an alternative embodiment of the present invention, an integrated circuit digital BTSC encoder is provided for encoding first and second digital audio signals into a BTSC encoded signal. The BTSC encoder includes a sum channel processor and a difference channel processor. In addition, the BTSC encoder includes a higher order digital filter constructed of a cascade of lower order allpass filters for filtering a digital audio signal as part of the BTSC encoding process. The higher order digital filter may be implemented as part of the sum channel processor (such as in the 75 μsecond preemphasis filter), as part of the difference channel processor (e.g., the fixed preemphasis filter or variable emphasis filter) or as part of the input or output low pass filter modules. In a selected embodiment, the digital BTSC encoder operates at a sample rate of approximately at least ten times the bandwidth of the signal being encoded (for example, at least approximately 150-200 kHz in an audio encoding application) so that said digital filters in the sum channel processor and the difference channel processor substantially match BTSC analog filter transform functions in both magnitude and phase. In yet a further embodiment of the present invention, a single chip set top box integrated circuit digital BTSC encoder is provided for encoding first and second digital audio signals into a BTSC encoded signal. Included as part of the BTSC encoder is a higher order IIR filter implemented using a plurality of lower order allpass IIR filters. Each lower order allpass IIR filter is characterized in having no limit cycle oscillations and a flat or unit response.

The objects, advantages and other novel features of the present invention will be apparent from the following detailed description when read in conjunction with the appended claims and attached drawings.

DETAILED DESCRIPTION

Figure 1:
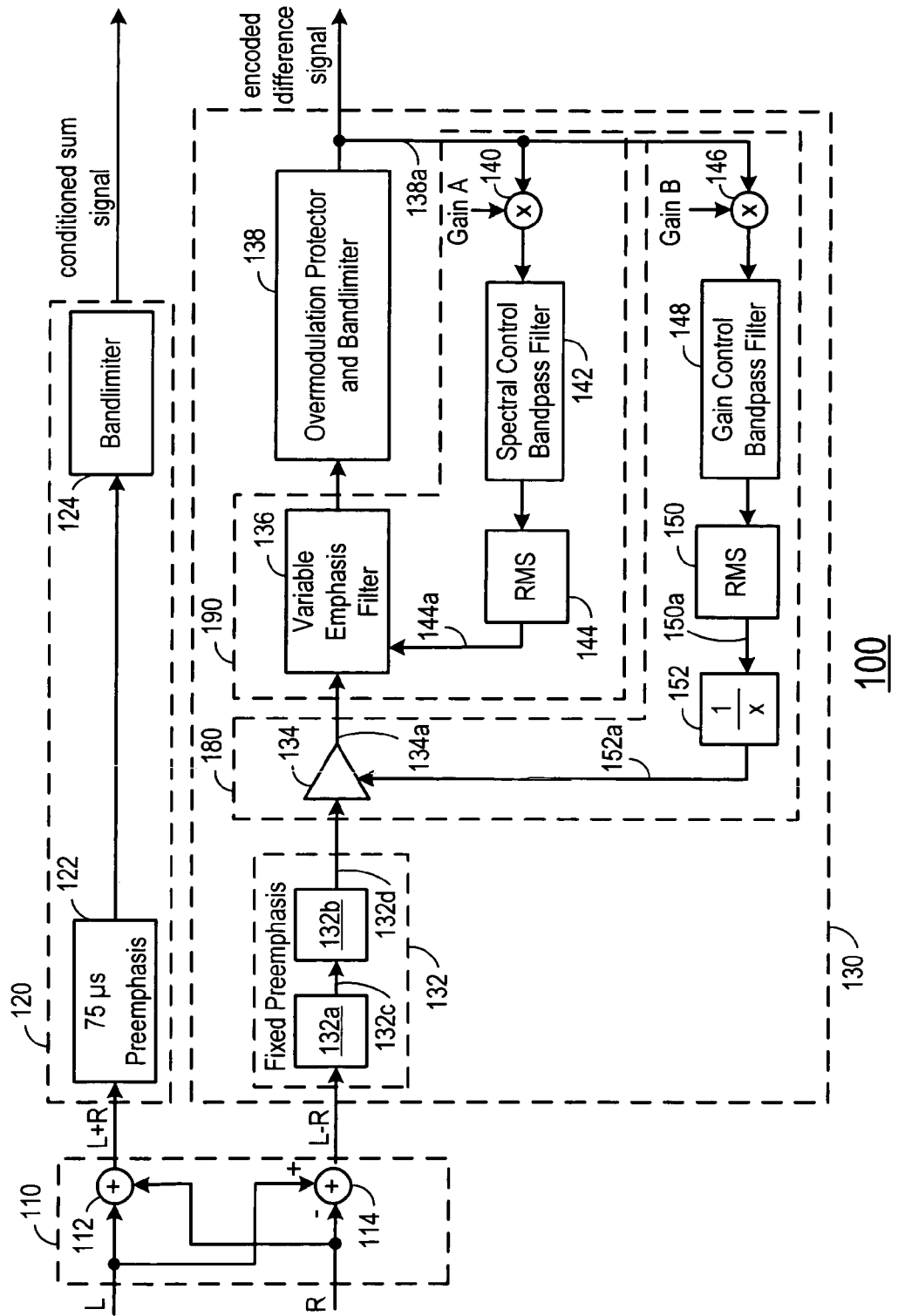
FIG. 1 shows a block diagram of a prior art analog BTSC encoder.
Figure 2:
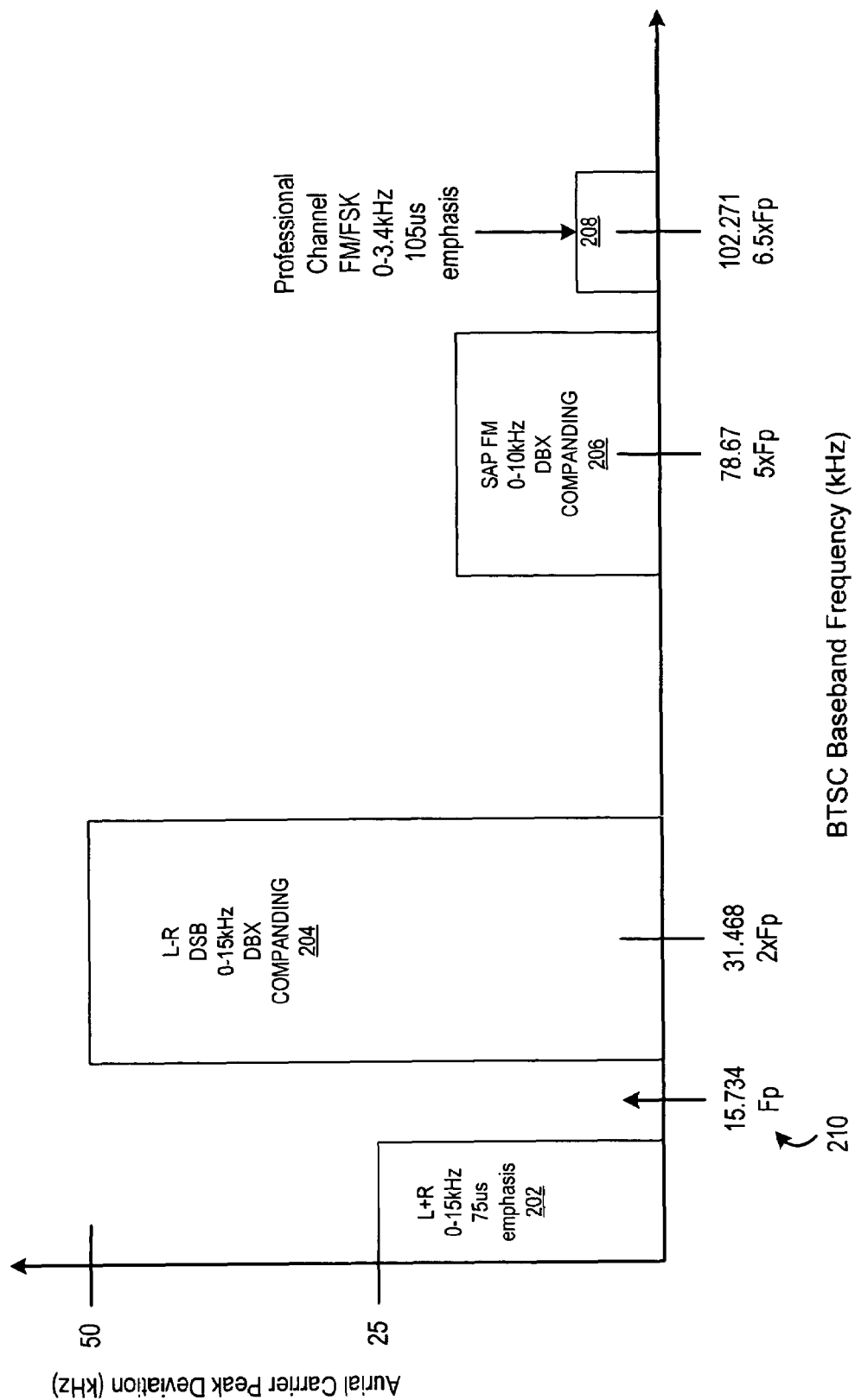
FIG. 2 is a graph of the spectrum of the BTSC composite signal.
Figure 3:
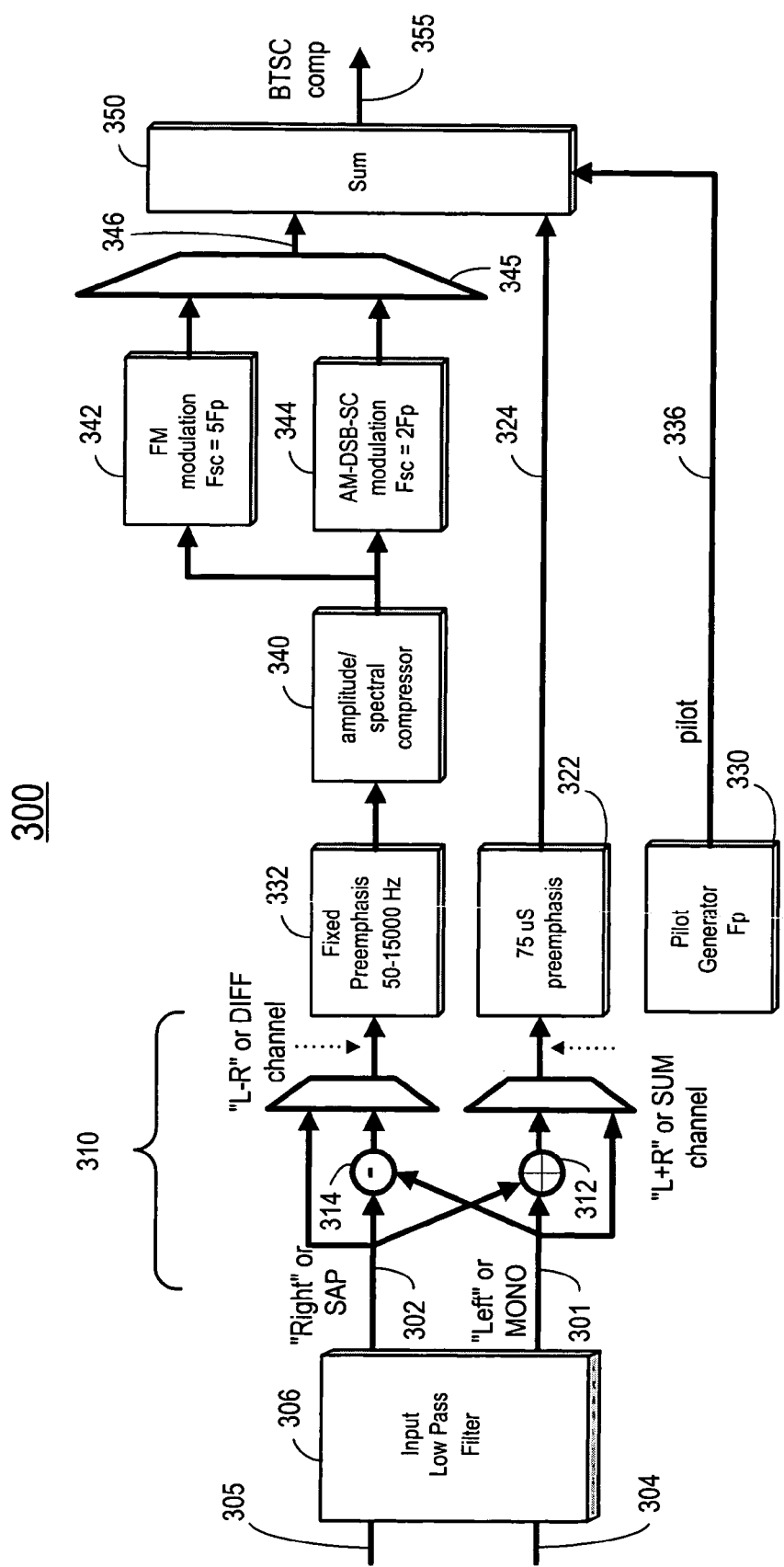
FIG. 3 depicts a system level description of a BTSC encoder in accordance with the present invention.

An apparatus and method in accordance with the present invention provide an improved digital implementation of a higher order digital filter for use in audio encoding by breaking the filter down into a cascade of lower order allpass filters. The present invention can be used in connection with a variety of digital filters, including Butterworth, Chebychev and elliptical filters. In a selected embodiment, the present invention is implemented as an eleventh order low pass Cauer filter in the main channel of a BTSC encoder. A system level description of the operation of a BTSC encoder application of the present invention is shown in FIG. 3 which depicts a diagram of a digital BTSC encoder 300. As depicted in FIG. 3, the output of encoder 300 is a BTSC compliant signal which combines the encoded difference signal, conditioned sun signal and pilot tone and which includes stereo and SAP functionality for stereo encoding, advantageously sharing an amplitude/spectral compressor circuit 340 to thereby reduce the circuit size. It will be appreciated that the encoder of the present invention may also be implemented to provide the professional channel encoding specified by the BTSC standard, or may otherwise output a baseband BTSC multiplex signal at output 355. As seen from the graph of the spectrum of the BTSC composite signal shown in FIG. 2, the pilot subcarrier is in close proximity to the sum channel signal spectral sideband, there being a separation of only 734 Hz. In accordance with an embodiment of the present invention, a low pass filter having a sharp cutoff is provided by using a higher order (for example, eleventh order) infinite impulse response (IIR) elliptical Cauer low pass filter using the allpass decomposition to filter out any sum channel frequencies above 15 kHz.

In connection with the system level description of FIG. 3, when monophonic (MONO) audio processing is desired, the Left and Right channels of the input stereo audio signal 301, 302 are summed (in summer 312) and passed to a 75 μsecond preemphasis filter 322. This datapath is considered to be the SUM channel. The 75 μsecond preemphasis filter 322 provides extra gain to the high-frequency components. The output of the preemphasis filter 322 is passed directly to the summing device 350. The other two inputs to the final summation 350 in the BTSC encoder 300, which are the DIFF channel output 346 and the pilot tone 336, are zeroed out.

Note that the SUM channel is sometimes referred to as the L+R channel, and the DIFF channel is sometimes referred to as the L-R channel.

When SAP (secondary audio program) processing is desired in the encoder of FIG. 3, the monophonic SAP signal replaces the "Right" audio input channel. The BTSC encoder first sharply bandlimits the SAP audio input stream to 10 kHz using a low pass filter 306. The resulting signal is passed through the DIFF channel to a fixed preemphasis filter 332 whose characteristics are defined in FCC OET-60 publication. The output of filter 332 is passed to an amplitude/spectral compressor module 340. The output of amplitude/spectral compressor 340 FM modulates the carrier sine wave whose frequency is five times the pilot rate (15.734 kHz).

When dual monophonic (DUAL MONO) operation is desired, a monophonic audio signal replaces the "Left" audio input channel, and the SAP signal replaces the "Right" audio input channel. Thus, the main monophonic signal is transmitted through the SUM channel at the same time that the SAP signal is transmitted through the DIFF channel. Note that in this case, the left audio input 300 and right SAP input 302 bypass the adder 312 and subtractor 314 and pass through the multiplexers 316, 318 to the sum channel and difference channel.

Stereo processing is very similar to dual monophonic processing. In the encoder of FIG. 3, an input section 310 receives the left and right channel audio input signals and generates therefrom a sum signal and a difference signal. A signal addition device 312 produces the SUM (L+R) channel based on the sum of the Left and Right channels of the input stereo audio signal. A signal subtraction device 314 produces the DIFF (L-R) channel based on the difference between the Left and Right channels of the input stereo audio signal. It will be appreciated that a matrix functionality may be used to receive the digital left and digital right signals and to generate the digital sum signal and digital difference signal. The SUM channel is passed through the 75 μsecond preemphasis filter 322, and the DIFF channel is passed through the fixed preemphasis filter 332 and the amplitude/spectral compressor module 340. The output of amplitude/spectral compressor 340 is passed to the AM-DSB-SC modulator 344, where it amplitude modulates a sine wave carrier whose frequency (31.468 kHz) is equal to twice that of the pilot tone (15,734 Hz). The output 346 of this modulator, along with sum channel output 324 and pilot signal 336, is passed to the sum block 350 that produces the BTSC composite signal 355. The output of encoder 300 is a BTSC composite signal 355 that is used to FM modulate the aural carrier.

Figure 4:
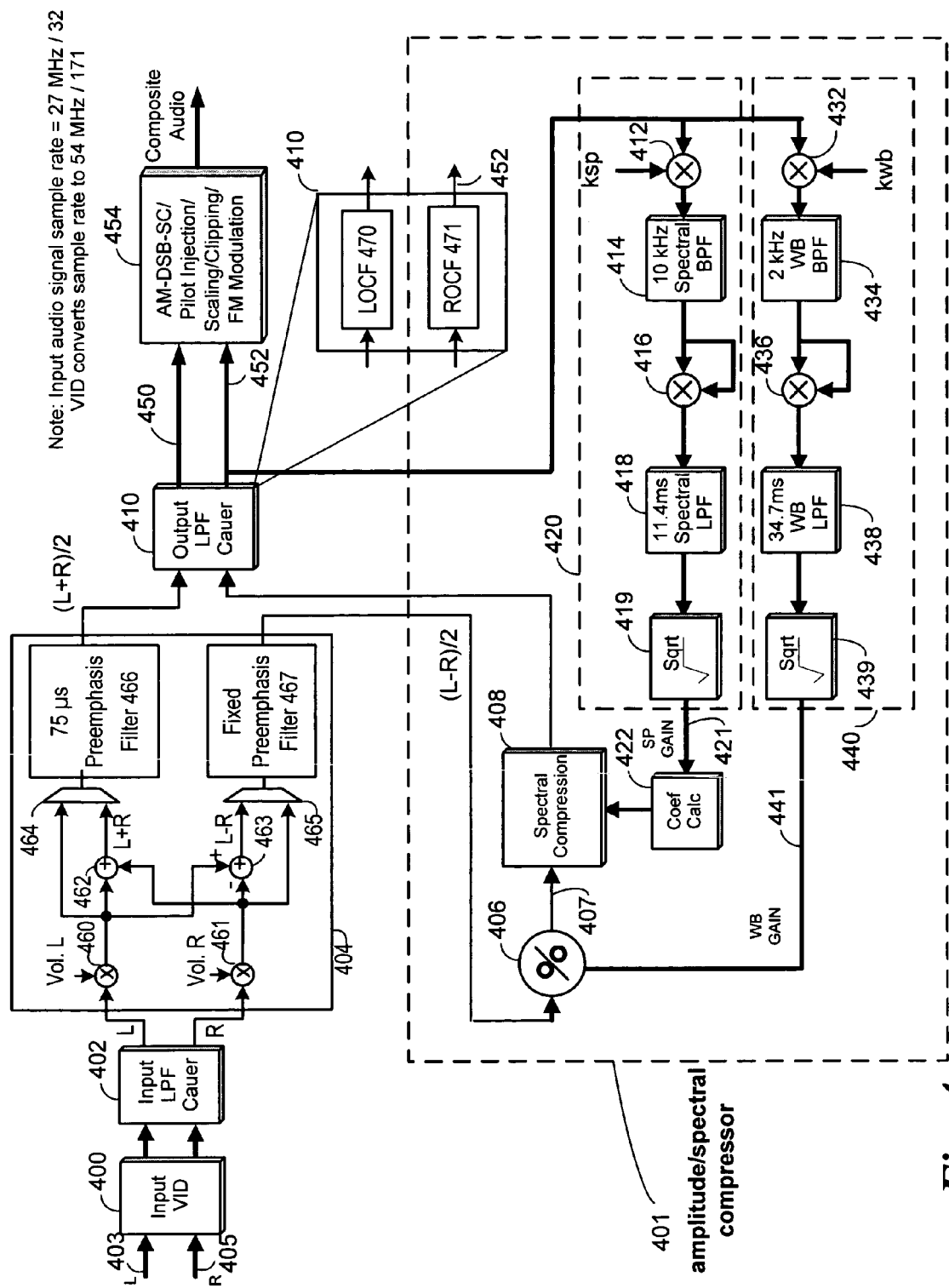
FIG. 4 depicts a block diagram of an alternate embodiment showing additional details of a BTSC encoder in accordance with the present invention.

FIG. 4 depicts a block diagram of an alternate embodiment showing additional details of an amplitude and spectral compressor where the digital filter of the present invention may be advantageously used. As depicted in FIG. 4, the difference channel processor consists of the fixed preemphasis filter 467, the compressor 401, and the right output Cauer filter 471, which is a low pass filter. The compressor 401 is composed of the wideband gain loop and the spectral gain loop. The wideband gain loop is formed by components 406, 408, 471, and 440. The spectral gain loop is formed by components 408, 471, 420 and 422. The wideband RMS detectors 440 and the spectral RMS detectors 420 monitor the compressor output 452 and produce the wideband gain (WB GAIN 441) and the spectral gain (SP GAIN 421), respectively. The wideband gain is used to control the wideband amplifier 406, which is essentially a divider. Using a clamp or saturator in the WB gain path (e.g., in block 439), the divider output 407 is saturated to the maximum or minimum value (depending upon the sign of the input) if the wideband gain 441 reaches a minimum threshold value. A similar clamping technique may be used in the spectral gain loop to control the spectral gain value (SP GAIN 421) that is used to compute the coefficients of the spectral compressor 408 using the coefficient calculator 422, on-the-fly. Three divide operations are required to calculate the coefficients and these are also performed on-the-fly in the coefficient calculator 422.

Another way of viewing the difference channel processor shown in FIG. 4 is that the amplitude/spectral compressor module 401 is essentially a wideband gain stage 406 that is followed by a variable preemphasis filter, or spectral compressor, 408. The wideband gain stage 406 is controlled by the WB GAIN signal 441 through the wideband gain loop or feedback path. The spectral compressor 408 is controlled by the SP GAIN signal 421 through the spectral gain loop or feedback path. As depicted, the feedback paths of the BTSC encoder begin at the output 452 of the right low pass Cauer filter ROCF 471. These feedback paths are used to control the wideband divider 406 and spectral compressor 408. The spectral feedback path control signal is based on the RMS power that passes through a bandpass filter 414 with a 10 kHz center frequency. The wideband feedback path control signal is based on the RMS power that passes through a bandpass filter 434 with a 2 kHz center frequency. When the input signal to the BTSC encoder is a low frequency signal, the feedback paths are dominated by noise because the signal lies outside the passband of the bandpass filters 414, 434.

As indicated in FIG. 4, the BTSC encoder receives two audio channel inputs (L 403 and R 405). To allow proper digital processing of the signals, the encoder should operate at a sufficiently high rate (for example, 10-20 times the audio bandwidth) to allow the analog and digital filters to match in phase and amplitude. The choice of the sampling rate is driven by the need for the digital filter implementations to more closely match the analog filter transform functions (specified by the BTSC standard) in both magnitude and phase. A sample rate over about 200 kHz (e.g., 316 kHz) results in good matching of the magnitude and phase responses between the analog and digital domains so that no phase compensation is needed in the encoding process. In a selected embodiment, two channel inputs 403, 405 which arrive at a first sample rate (e.g., 27 Mhz/32) are converted to a second sample rate (e.g., 54 MHz/171) by the input VIDs (Variable Rate Interpolator Decimator) 400.

The input streams to the encoder are filtered by low pass Cauer filters 402 to limit the bandwidth of signals for system compliance. For MONO mode of operation (with stereo and SAP turned off), the two audio inputs may be programmably limited to 15-20 kHz or to other frequencies. For STEREO mode of operation, the two audio inputs are limited to 15 kHz. For MONO/SAP mode of operation, the input 403 for audio channel 1 is limited to 15 kHz while the input 405 for audio channel 2 is limited to 10 kHz. This low pass filtering operation is achieved by reprogramming the coefficients to the low pass Cauer filters for each mode of operation. By designing the input low pass Cauer filters to have sharp transition bands, emphasis of noise outside of the audio bands is prevented during the encoding operation. By providing input filters with stop-band attenuation of -70 dB, good rejection of the input out-of-band noise after the preemphasis is provided.

In the encoding system, output low pass Cauer filters 470, 471 reduce the high-frequency out-of-band noise that is amplified by the 75 μsecond preemphasis filter 466, 467 and compressor 401. The resulting filtered digital sum signal 450 and filtered digital difference signal 452 may be processed, programmably scaled, clipped and frequency modulated in the modulator block 454. Modulator 454 is used to inject the pilot subcarrier that is frequency locked to the horizontal scanning frequency of the transmitted video signal, as required by the Multichannel Television Sound MTS standard (FCC OET-60). In addition, AM-DSB-SC or FM modulation may be implemented in modulator 454 for modulating the digital difference signal output 452.

Figure 5:
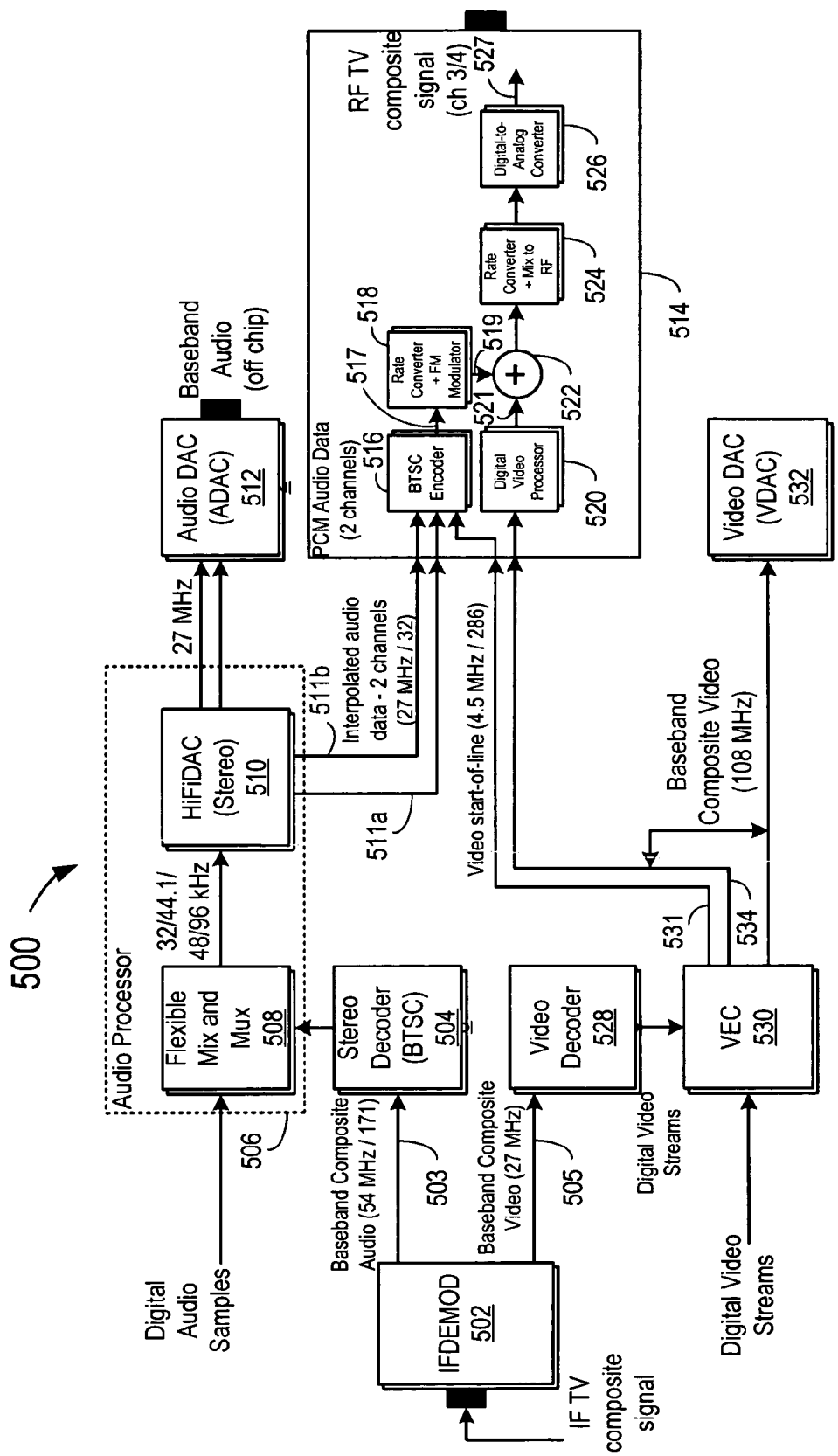
FIG. 5 is a diagram illustrating an application of the present invention in the RFM unit of a set-top box chip.
Figure 7:
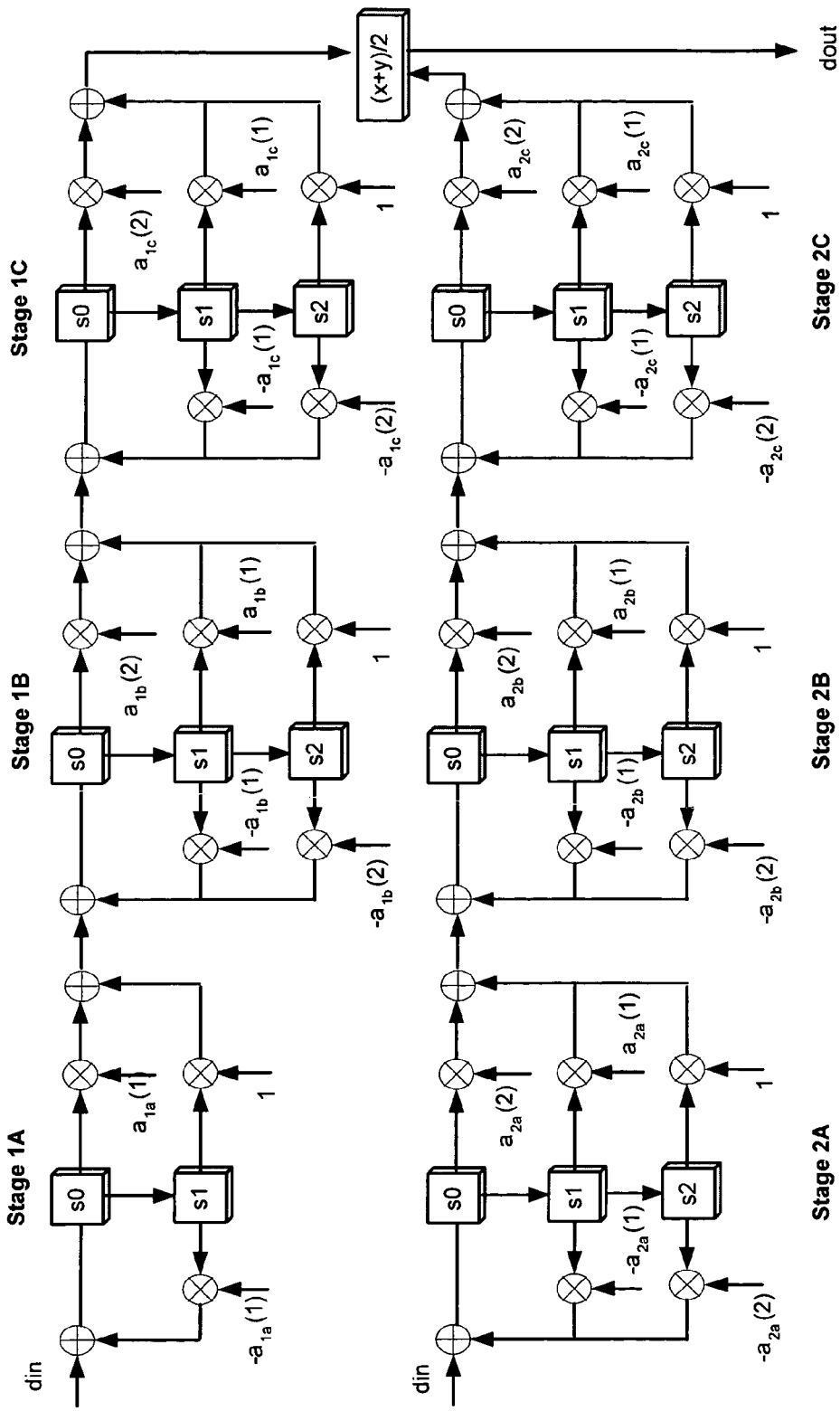
FIG. 7 depicts an eleventh order elliptical Cauer filter implemented using an allpass decomposition.

As referenced above, the present invention has many potential applications. For example, the allpass decomposition architecture may be used for an input filter to low pass filter the input signals to a BTSC encoder, such as depicted variously in FIGS. 3 and 4. The present invention may also be integrated as part of a single chip set-top box fabricated with CMOS technology. The present invention may also be included in an RF modulator core (RFM 514) as depicted in FIG. 5 for generating the RF TV composite signal that is used by a set-top box to generate channel ¾ (or such) output signal(s) 527. In this application, the baseband BTSC composite signal 517 is fed to an FM modulator 518 that modulates the aural carrier, and the resulting signal 519 is then summed with a baseband composite video signal 521 with adder 522. The combined audio/video signal is mixed to an RF frequency 524, converted to analog form 526 and sent off chip 527. In the depicted embodiment, RFM 514 converts a NTSC/PAL/SECAM compliant digital composite video source 534 and a pulse code modulated (PCM) audio source 511*a*, 511*b* into an analog composite television signal 527 that is suitable for demodulation by a television demodulator. Moreover, the audio source may be stereo encoded according to the BTSC standard. When BTSC encoding is used, a digital filter embodiment of the present invention (such as illustrated in FIG. 7) may be used to low pass filter the input signals to the BTSC encoder, to low pass filter the output signals generated by the BTSC encoder, to perform preemphasis filtering in the main channel or to filter the feedback signals in the stereo channel.

In a single chip integrated circuit embodiment of the present invention, a digital BTSC encoder 516 is disclosed for encoding stereo audio signals 511*a*, 511*b*, where the encoder 516 is integrated as part of a single chip set-top box 500 fabricated with CMOS technology. Upon integration into a set-top box chip 500, the present invention reduces board level components, thereby reducing costs and improving performance over prior art approaches. Thus, the present invention shows, for the first time, a fully integrated digital BTSC encoder 516 that may be implemented in CMOS as part of a single chip set-top box 500.

The block diagram in FIG. 5 shows the various operations to be performed in the RFM 514, as well as the primary datapath input and output signals, beginning with the reception of transmitted television composite audio/video signal at the intermediate frequency demodulator 502, which extracts the baseband composite audio signal 503 and baseband composite video signal 505. As depicted in the context of a set-top box chip shown in FIG. 5, the RFM 514 can be considered to be a part of the audio/video back end. A simplified drawing of part of a set-top box is depicted in FIG. 5 with a focus on the operations performed for an analog television channel.

The primary audio source for the RFM 514 is the High Fidelity DAC 510 (HiFiDAC) that is part of the audio processor 506. As shown, BTSC decoder 504 receives the baseband composite audio signal 503 and generates a decoded audio signal for the mixer 508. HiFiDAC 510 provides two channels (511*a*, 511*b*) of pulse code modulated (PCM) audio data to the RFM 514. The primary video source for the RFM 514 is the video encoder 530 (VEC) which receives digital video stream data from the video decoder 528. VEC 530 provides the NTSC, PAL, or SECAM encoded digital baseband composite video signal 534 that accompanies the HiFiDAC's audio signal. VEC 530 also provides a video start-of-line signal 531 that allows the RFM to lock its audio subcarriers to the video line rate.

In terms of the audio/video backend functionality of the set-top box chip 500, the RFM 514 includes a digital audio processor portion (516, 518), a digital video processor portion (520) and a digital audio/video processor portion (522, 524, 526). The digital audio processor portion includes the BTSC encoder 516 and rate converter with FM modulator 518. The RFM 514 accepts four input signals, including three input signals for the BTSC encoder 516 which are expected to be employed in normal operation and a baseband composite video input signal 534. The first two BTSC encoder input signals are two channels of audio PCM data 511*a*, 511*b*. The third BTSC encoder input signal is the video start-of-line signal 531, which is used to synchronize the pilot tone needed for BTSC encoding to the video line rate. The BTSC encoded audio is combined with the video data at adder 522 at the digital audio/video processor and then rate converted, mixed to RF (524) and converted from digital to analog format (526) to generate the RF TV composite output signal 527. In a selected embodiment, the digital video 521 and FM modulated audio 519 signals are converted and mixed at block 524 to a programmable carrier frequency that may be chosen from 0 to 75 MHz, which includes NTSC channels 2, 3 and 4. In order to maintain reasonable separation of the spectral images in the analog output of the digital-to-analog converter, the DAC 526 is clocked with as high a clock rate as possible.

In a selected embodiment, the present invention provides a technique for producing a digital BTSC multiplex or composite signal with good stereo separation, with reduced crosstalk in the pilot spectrum space, and/or with digital filtering that is devoid of limit cycle behavior. A hardware-efficient multi-channel sound encoding system can provide proper digital processing of the signals by operating at a minimum rate of about ten times the signal bandwidth, e.g., 150-200 kHz. The choice of the sampling rate is driven by the need for the digital filter implementations to more closely match the analog filter transform functions (specified by the BTSC standard) in both magnitude and phase. A sample rate of approximately 314-315 kHz results in good matching of the magnitude and phase responses between the analog and digital domains so that no phase compensation errors need to be introduced into the encoding process. In a selected embodiment, the encoder runs at (54 MHz/171)=315.789 kHz.

Figure 6:
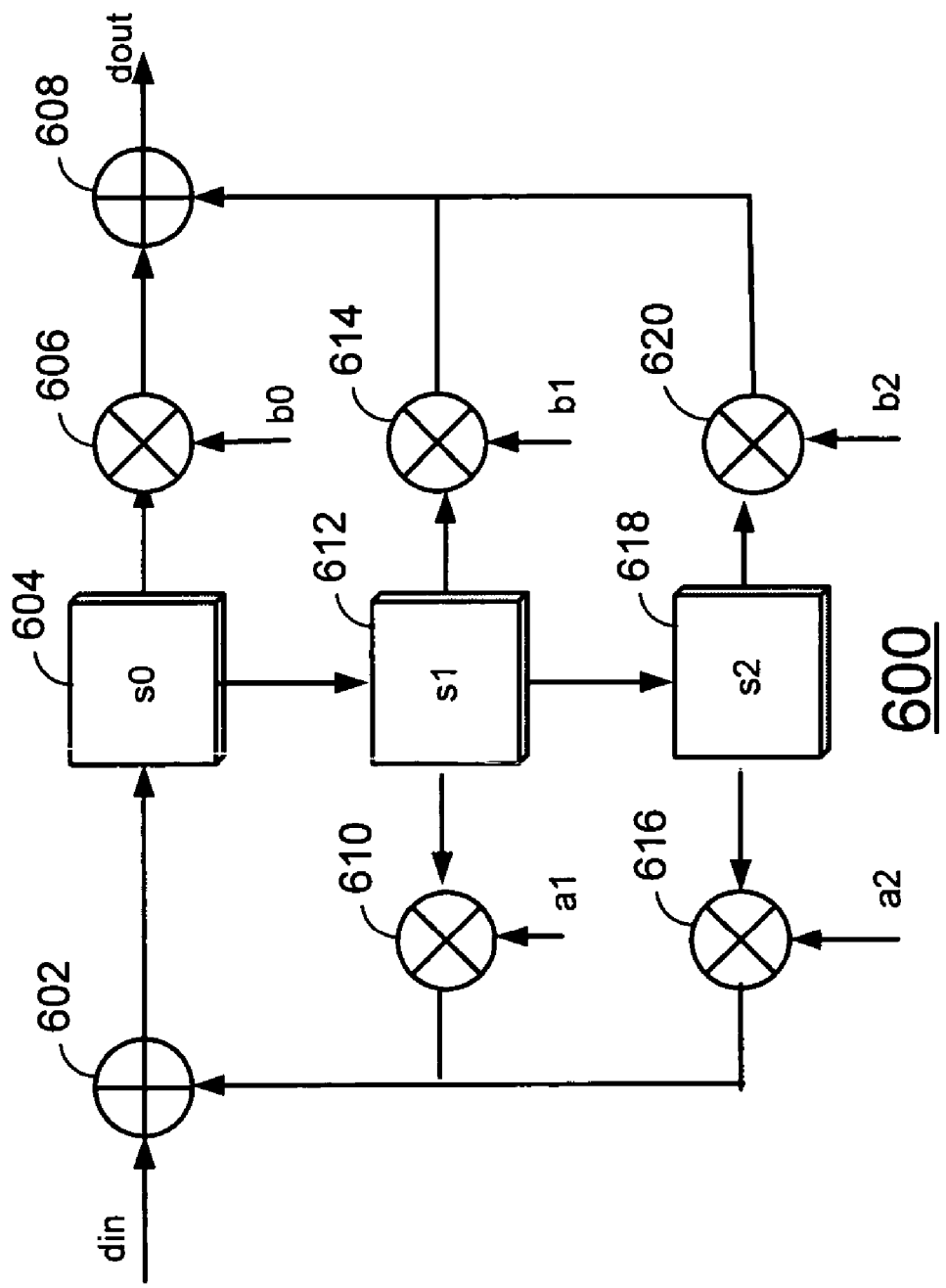
FIG. 6 depicts an IIR filter structure.

In a selected embodiment illustrated with reference to FIG. 4, the input low pass Cauer filters 402, preemphasis filters 404, output low pass Cauer filters 410, low pass filters 418, 438, bandpass filters 414, 434 and spectral compressor 408 have different numbers of taps and complexity, but they all follow the basic infinite impulse response filter structure 600 shown in FIG. 6. The boxes labeled s0 (604), s1 (612), and s2 (618) refer to delay elements. And the feedback coefficient taps are referred to as a1 (610), a2 (616), etc. The feed forward coefficients are referred to as b0 (606), b1 (614), b2 (620), etc. As illustrated in the embodiment of the present invention depicted in FIG. 6, an IIR filter structure is used in the BTSC encoder that consists of a second order allpass filter having a unit magnitude at all frequencies. A first delayed version of the input signal (din) is output by delay element 604 for scaling by coefficient (b0) and for additional delay by delay element 612, thereby generating a second delayed version of the input signal (din). The second delayed version of the input signal is fed back (along with a third delayed version of the input signal from delay element 618) for combination with the input signal at adder 602. In addition, the second and third delayed versions of the input signal are scaled (by coefficients b1 and b1) and combined with the scaled first delayed version at adder 608 to generate a filter output (dout).

In situations where the digital filter is derived from an analog filter whose transform is specified, a mapping from the analog to the digital domain is advantageously accomplished using a bilinear transform, so long as the sampling rate is sufficiently high that the amplitude and phase of the digital filter closely approximate the original analog designs in the frequencies of interest. In the example of deriving digital filters for the analog filters specified by the BTSC encoding standard, this derivation determines the coefficient values (a1, b1, etc.) for the filter structure. However, in situations where the digital filter is derived from an analog filter whose transform is not specified, it will be appreciated that the coefficient values can be adjusted to provide application-specific filter performance, provided that the flat frequency response for the allpass filter is retained.

When implemented as a low pass or high pass filter, an IIR filter structure of the present invention provides sharper cutoff than a finite impulse response (FIR) filter. In addition, it will be appreciated that higher order IIR filters provide even sharper cutoff performance. The most complex IIR filters in the BTSC encoder are the input and output low pass filters 402, 410. For example, an eleventh order elliptical Cauer IIR filter 700 implemented using the allpass decomposition is shown in FIG. 7. The labeling of the feedback coefficients (an), feed forward coefficients (bn) and delay elements (sn) is as described in FIG. 6, where "n" can be an element from the set {1a, 1b, 2a, 2b, 1c, 2c}. The filter implementation uses five second-order stages (stages 1B, 1C, 2A, 2B and 2C) and one first order stage (stage 1A), where each stage is an allpass filter. The cascading of allpass stages (with unity gain) help in containing word-length growth from one stage to the next. As shown, a cascaded combination of allpass feedback filters is used to provide good low pass behavior for the eleventh order Cauer filter, and does so with fewer multipliers, lower cost, increased efficiency, less oscillation and better performance.

While the system and method of the present invention has been described in connection with the preferred embodiment, it is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A BTSC signal encoder, comprising:
a first low pass filter to receive and filter a digital left channel audio signal and a right channel audio signal, in which the first low pass filter operates as a higher order infinite impulse response (IIR) digital filter implemented using an allpass decomposition architecture;
matrix means coupled to receive filtered left channel audio signal and right channel audio signal, sum the filtered left and right channel audio signals to generate a digital sum signal, and subtract one of the left or right channel audio signal from the other of the left or right channel audio signal to generate a digital difference signal;
sum channel processing means coupled to process the digital sum signal;
difference channel processing means coupled to process the digital difference signal, wherein the difference channel processing means includes a wideband amplifier and a spectral compressor, in which a gain for the wideband amplifier is set by a wideband gain feedback loop and a gain for the spectral compressor is set by a spectral gain feedback loop; and
a second low pass filter to receive and filter an output of the difference channel processing means, in which the second low pass filter operates as a higher order IIR digital filter implemented using an allpass decomposition architecture and in which an output from the second low pass filter is coupled for processing with an output of the sum channel processing means and also coupled as feedback input to the wideband gain feedback loop and to the spectral gain feedback loop;
wherein the first and second low pass filters, matrix means, sum channel processing means and the difference channel processing means operate at a sample rate to substantially match BTSC analog filter transform functions in both magnitude and phase.

2. The BTSC signal encoder of claim 1, wherein the first and second low pass filters are Cauer low pass filters.

3. The BTSC signal encoder of claim 1, further including a third low pass filter coupled to receive and filter an output of the sum channel processing means, in which the third low pass filter operates as a higher order IIR digital filter implemented using an allpass decomposition architecture.

4. The BTSC signal encoder of claim 1, wherein each of the low pass filters includes a sum of multiple cascades of lower order allpass filters.

5. The BTSC signal encoder of claim 4, wherein each of the cascade of lower order allpass filters implements a combination of first and second order allpass filters.

6. The BTSC signal encoder of claim 1, wherein the first and second low pass filters are Butterworth low pass filters.

7. The BTSC signal encoder of claim 1, wherein the matrix means includes at least one preemphasis filter which is a higher order IIR digital filter implemented using an allpass decomposition architecture.

8. The BTSC signal encoder of claim 1, wherein the difference channel processing means includes a bandpass filter which is a higher order IIR digital filter implemented using an allpass decomposition architecture.

9. The BTSC signal encoder of claim 1, wherein the BTSC signal encoder operates at the sample rate of approximately 150-200 KHz.

10. The BTSC signal encoder of claim 1, wherein the first and second low pass filters are eleventh order Cauer low pass filters.

11. The BTSC signal encoder of claim 10, wherein each of the eleventh order Cauer low pass filters implements a combination of first and second order allpass filters.

12. The BTSC signal encoder of claim 10, wherein each of the eleventh order Cauer low pass filters implements a combination of one first order and five second order allpass filters.

13. The BTSC signal encoder of claim 1, wherein the BTSC signal encoder is fabricated on a single silicon substrate using CMOS processing.

14. The BTSC signal encoder of claim 1 in which the BTSC signal encoder is implemented in a set top box.

* * * * *

UNITED STATES PATENT AND TRADEMARK OFFICE
CERTIFICATE OF CORRECTION

PATENT NO. : 7,532,728 B2 Page 1 of 1
APPLICATION NO. : 10/784574
DATED : May 12, 2009
INVENTOR(S) : Gopal Venkatesan et al.

It is certified that error appears in the above-identified patent and that said Letters Patent is hereby corrected as shown below:

Title Page, Item (54): The title should appear as follows: "Mechanism for using the allpass decomposition architecture for the cauer low pass filter used in a BTSC encoder."

Column 1, lines 1-4: The title should appear as follows: "Mechanism for using the allpass decomposition architecture for the cauer low pass filter used in a BTSC encoder."

Signed and Sealed this

Fourteenth Day of July, 2009

JOHN DOLL
*Acting Director of the United States Patent and Trademark Office*